(12) United States Patent
Shi et al.

(10) Patent No.: US 10,888,855 B2
(45) Date of Patent: Jan. 12, 2021

(54) SILICON-TITANIUM DIOXIDE-POLYPYRROLE THREE-DIMENSIONAL BIONIC COMPOSITE MATERIAL BASED ON HIERARCHICAL ASSEMBLY AND USE THEREOF

(71) Applicant: JIANGNAN UNIVERSITY, Wuxi (CN)

(72) Inventors: Gang Shi, Wuxi (CN); Ying Li, Wuxi (CN); Caihua Ni, Wuxi (CN); Dawei Wang, Wuxi (CN); Fei He, Wuxi (CN); Lifeng Chi, Wuxi (CN); Nan Lv, Wuxi (CN)

(73) Assignee: JIANGNAN UNIVERSITY, Wuxi (CN)

( * ) Notice: Subject to any disclaimer, the term of this patent is extended or adjusted under 35 U.S.C. 154(b) by 536 days.

(21) Appl. No.: 15/748,760

(22) PCT Filed: May 12, 2016

(86) PCT No.: PCT/CN2016/081791
§ 371 (c)(1),
(2) Date: Jan. 30, 2018

(87) PCT Pub. No.: WO2017/113563
PCT Pub. Date: Jul. 6, 2017

(65) Prior Publication Data
US 2019/0009261 A1 Jan. 10, 2019

(30) Foreign Application Priority Data

Dec. 28, 2015 (CN) .......................... 2015 1 0994514

(51) Int. Cl.
| | | |
|---|---|---|
| *B01J 35/00* | (2006.01) |
| *H01L 51/42* | (2006.01) |
| *H01L 21/306* | (2006.01) |
| *B01J 21/06* | (2006.01) |
| *B01J 31/38* | (2006.01) |
| *B01J 37/02* | (2006.01) |
| *H01L 51/00* | (2006.01) |
| *C02F 1/72* | (2006.01) |
| *C30B 29/06* | (2006.01) |
| *C30B 29/16* | (2006.01) |
| *C30B 29/58* | (2006.01) |
| *C30B 29/66* | (2006.01) |
| *C30B 7/10* | (2006.01) |
| *C01G 23/053* | (2006.01) |
| *C30B 29/60* | (2006.01) |
| *C30B 29/32* | (2006.01) |
| *B01J 31/06* | (2006.01) |
| *C02F 1/32* | (2006.01) |
| *B82Y 40/00* | (2011.01) |
| *B82Y 30/00* | (2011.01) |
| *C02F 101/30* | (2006.01) |

(52) U.S. Cl.
CPC ........... *B01J 35/0033* (2013.01); *B01J 21/06* (2013.01); *B01J 21/063* (2013.01); *B01J 31/06* (2013.01); *B01J 35/004* (2013.01); *B01J 35/0006* (2013.01); *B01J 35/0013* (2013.01); *B01J 37/0217* (2013.01); *B01J 37/0228* (2013.01); *B01J 37/0244* (2013.01); *C01G 23/053* (2013.01); *C30B 7/10* (2013.01); *C30B 29/06* (2013.01); *C30B 29/16* (2013.01); *C30B 29/32* (2013.01); *C30B 29/58* (2013.01); *C30B 29/60* (2013.01); *C30B 29/66* (2013.01); *H01L 21/30608* (2013.01); *H01L 51/0035* (2013.01); *H01L 51/4213* (2013.01); *H01L 51/4226* (2013.01); *B01J 31/38* (2013.01); *B82Y 30/00* (2013.01); *B82Y 40/00* (2013.01); *C01P 2004/16* (2013.01); *C01P 2004/62* (2013.01); *C01P 2004/64* (2013.01); *C02F 1/32* (2013.01); *C02F 1/725* (2013.01); *C02F 2101/308* (2013.01); *C02F 2305/10* (2013.01); *Y02W 10/37* (2015.05)

(58) Field of Classification Search
CPC B01J 35/0033; B01J 35/0006; B01J 35/0013; B82Y 30/00; B82Y 40/00
See application file for complete search history.

(56) References Cited

U.S. PATENT DOCUMENTS 7,303,723 B2  12/2007  Akbar et al.

FOREIGN PATENT DOCUMENTS

| CN | 101555629 A | | 10/2009 | |
| CN | 104677767 | * | 6/2015 | ............... G01N 5/00 |
| CN | 104677767 A | | 6/2015 | |
| DE | 102004029303 A1 | | 1/2006 | |

* cited by examiner

*Primary Examiner* — Yong L Chu
(74) *Attorney, Agent, or Firm* — SZDC Law P.C.

(57) ABSTRACT

The invention relates to a three-dimensional bionic composite material based on refection elimination and double-layer P/N heterojunctions. The preparation method of the composite material comprises: (1) anisotropically etching a silicon wafer with an alkaline solution, to form compactly arranged tetragonal pyramids on the surface of the silicon wafer; (2) performing hydrophilic treatment on the silicon wafer, growing TiO2 crystal seeds on the surface of the silicon wafer, and calcining the silicon wafer in a muffle furnace; (3) putting the silicon wafer obtained in the step (2) into a reaction kettle, and growing TiO2 nano-rods on the side walls of silicon cones by a hydrothermal synthesis method; and (4) depositing PPY nano-particles on the TiO2 nano-rods. The composite material has good refection elimination performance and efficient photogenerated charge separation capability, and is applicable in fields of photocatalysis, photoelectric conversion devices, solar cells and the like.

10 Claims, 2 Drawing Sheets

SILICON-TITANIUM DIOXIDE-POLYPYRROLE THREE-DIMENSIONAL BIONIC COMPOSITE MATERIAL BASED ON HIERARCHICAL ASSEMBLY AND USE THEREOF

This application is the US National Stage Application of PCT/CN2016/081791, filed on May 12, 2016, which claims priority to Chinese Patent Application No. 201510994514.8, filed on Dec. 28, 2015, which is incorporated by reference for all purposes as if fully set forth herein.

BACKGROUND OF THE INVENTION

1. Field of the Invention

The present invention relates to the technical field of photoelectric materials, and more particularly to a hierarchical-assembly-based ternary composite material, i.e., a silicon-titanium dioxide-polypyrrole composite material, such composite material can be used as photocatalytic and photoelectric conversion materials.

2. Description of the Related Art

In nature, sunlight as renewable green energy has aroused people's wide concern. It is important to find materials for efficient conversion during the process of conversion from solar energy to usable energy. Titanium dioxide is an important photoelectric conversion material, which has the advantages of high catalytic activity, good stability, high yield of hydroxyl radicals and non-corroding by illumination, and has excellent application prospects in the fields of anticorrosive paint, sewage purification, antibiosis and disinfection. However, the application of titanium dioxide the is limited due to the disadvantages of a wide forbidden band gap, easy compounding of photo-generated charges and a small effective wavelength range for utilizing sunlight.

The polypyrrole has good environmental stability and strong absorbability in a visible region, and is a strong electron donor and an excellent hole transport material. When the both are effectively compounded, a heterojunction will be formed on the contact interface, this not only can improve the separation efficiency of photo-generated charges, but also can enlarge the spectral response range of the composite material, and thus the utilization of the sunlight is improved. Patent CN101955665A discloses a method for preparing a polypyrrole particles/titanium dioxide nanotube arrays composite. Patent CN102350317A discloses a polypyrrole/titanium dioxide composite adsorbent, and methods for preparation, application and regeneration thereof. Patent CN102600907A discloses a polypyrrole-sensitized titanium dioxide hollow nanosized photocatalyst and a preparation method thereof. To a certain extent, the above patents solve some problems such as the large width of forbidden band, small spectral response range, easy compounding of photogenerated electron hole pairs of titanium dioxide. However, the polypyrrole/titanium dioxide composite still has the problems of poor ordering, easy agglomeration, low recycling rate, poor light absorptance etc., and thus the promotion and application of the polypyrrole/titanium dioxide composite are limited.

SUMMARY OF THE INVENTION

One object of the present invention is to provide a silicon-titanium dioxide-polypyrrole three-dimensional bionic composite material based on hierarchical assembly, for overcoming the defects of the conventional titanium dioxide/polypyrrole nanocomposite, such as disorder, easy agglomeration, recycling difficulty as well as low photoelectric conversion efficiency. The composite material has good refection elimination performance and efficient photogenerated charge separation capability, improves the photoelectric conversion efficiency and presents excellent photocatalysis capability. Furthermore, the composite material uses monocrystalline silicon as a carrier, and this is beneficial to recycling of material.

In one aspect, according to the technical solutions of the present invention, the invention provides a silicon-titanium dioxide-polypyrrole three-dimensional bionic composite material based on hierarchical assembly, namely silicon/titanium dioxide/polypyrrole (Si/TiO$_2$/PPY). Si is 100-type monocrystalline silicon with a tapered microstructure surface, and is a P-type semiconductor. Si has a compactly arranged silicon cone structure of tetragonal pyramids with a height of 4-10 μm. TiO$_2$ is TiO$_2$ nano-rods of rutile phase and is an N-type semiconductor, and is quadrangular with a height of 500-4000 nm and a diameter of 40-250 nm. TiO$_2$ is orderly and vertically grown on the side walls of the silicon cones. PPY is polypyrrole nano-particles with a diameter of 10-60 nm, and is a P-type semiconductor. PPY is uniformly grown on the surfaces of the TiO$_2$ nano-rods. Double P/N heterojunctions are formed on interfaces between Si and TiO$_2$, and between TiO$_2$ and PPY in the Si/TiO$_2$/PPY three-dimensional bionic composite material, and thus the composite material can efficiently separate photo-generated charges while having a three-dimensional bionic composite structure, and can effectively reduce the reflection of incident light on the surface.

In another aspect, the invention also provides a preparation method of the silicon-titanium dioxide-polypyrrole three-dimensional bionic composite material based on hierarchical assembly, the method includes the following steps:

(1) anisotropically etching a silicon wafer using an alkaline solution under stirring, to form a compactly arranged tetragonal pyramids on the surface of the silicon wafer;

(2) performing hydrophilic treatment on the silicon wafer etched in the step (1), growing TiO$_2$ crystal seeds on the surface of the silicon wafer, and calcining the silicon wafer for a period of time in a muffle furnace, followed by naturally cooling the silicon wafer;

(3) putting the silicon wafer having TiO$_2$ crystal seeds on surface thereof obtained in the step (2) into a reactor, and growing TiO$_2$ nano-rods on the side walls of silicon cones by a hydrothermal synthesis; and (4) depositing conductive PPY nano-particles on the TiO$_2$ nano-rods obtained in the step (3), to obtain the three-dimensional Si/TiO$_2$/PPY.

Preferably, the alkaline solution in step (1) is potassium hydroxide, tetramethylammonium hydroxide, sodium hydroxide, aqueous ammonia or EDP (a mixed solution of ethylenediamine, pyrocatechol and water). The alkaline solution has a pH of 12-14. The etching temperature is 50-90° C. and the etching time is 5-60 min. The stirring manner is mechanical stirring or magnetic stirring.

Preferably, the hydrophilic treatment in the step (2) comprises putting the silicon wafer obtained in the step (1) into a mixed solution of NH$_3$H$_2$O, H$_2$O$_2$ and H$_2$O in a volume ratio of 1:1:5. The heating temperature is 90° C. and the heating time is 30 min.

Preferably, growing TiO$_2$ crystal seeds in the step (2) comprises: submerging the silicon wafer after the hydrophilic treatment into a 0.05-1 mol/L solution of tetrabutyl titanate in isopropanol for pulling or spin coating, and calcining the resulting sample in the muffle furnace under 450-500° C. for 30-60 min. The pulling has a speed of 1-10 mm/s, and is repeated 5-30 times. The spin coating has a speed of 500-7000 revolutions per min.

Preferably, the hydrothermal synthesis in the step (3) comprises: treating the silicon wafer in the reactor filled with 10-20 mL of deionized water, 6-17 mL of concentrated hydrochloric acid (preferable a mass fraction of 37%) and 0.5-5 mL of tetrabutyl titanate at a temperature of 80-200° C. for 2-19 h, then taking the sample out and blow-drying it with nitrogen.

Preferably, depositing conductive PPY nano-particles on the $TiO_2$ nano-rods in the step (4) comprises depositing PPY conductive polymer particles on the $TiO_2$ nano-rods by an in-situ oxidation method, and the reaction condition is as follows: putting 0.01-0.06 g $FeCl_3$, 50-150 uL pyrrole, 5-10 mL ultrapure water into a beaker to obtain a reaction solution; putting a silicon wafer having an area of 1.5 cm×1.0 cm and having the $TiO_2$ nano-rods grown on surface thereof into the reaction solution, and stirring for 10-30 min at room temperature, to obtain the $Si/TiO_2/PPY$ three-dimensional bionic composite material.

In still other aspect, the present invention further provides use of the three-dimensional $Si/TiO_2/PPY$ composite material as a photo-catalyst for degrading an organic pollutant. The three-dimensional $Si/TiO_2/PPY$ composite material having an area of 1.5 cm×1.0 cm is put into 5 mL of $1.0×10^{-5}$ mol/L methylene blue solution, then the solution is put in dark for 1 h to achieve an adsorption-desorption balance, and then the solution is irradiated by a light source to degrade methylene blue.

In another aspect, the present invention further provides use of the silicon-titanium dioxide-polypyrrole three-dimensional bionic composite material based on hierarchical assembly in the fields of photocatalysis and photoelectric conversion devices.

In still other aspect, the present invention further provides use of the silicon-titanium dioxide-polypyrrole three-dimensional bionic composite material based on hierarchical assembly in the field of solar cells.

As compared with the prior art, the present invention has the following advantages:

(1) The composite material of the invention has hierarchically and orderly assembled $TiO_2$ nano-rods and PPY nano-particles on the surface of silicon cones to form a three-dimensional bionic composite structure, and has excellent reflection elimination performance.

(2) The side walls of the silicon cones are contact with the $TiO_2$ nano-rods, and the $TiO_2$ nano-rods are contacted with the PPY nano-particle, such that the double-layer nano P/N heterojunctions are formed. This effectively separates photo-generated current carriers, reduces composition of electrons-hole pairs, and has excellent photoelectric conversion efficiency.

(3) The three-dimensional $Si/TiO_2/PPY$ composite material has high specific surface area, increases the effective catalytic active sites on the surface, and has certain application value in photo-catalytic degradation of pollutants.

(4) The preparation method of the three-dimensional $Si/TiO_2/PPY$ composite material is simple, mild and controllable, and has low requirement for reaction equipment. Furthermore, the composite material is easy to recycle and reuse, and can meet the requirement for large-scale production.

DETAILED DESCRIPTION OF THE PREFERRED EMBODIMENTS

Embodiment 1

Figure 1:
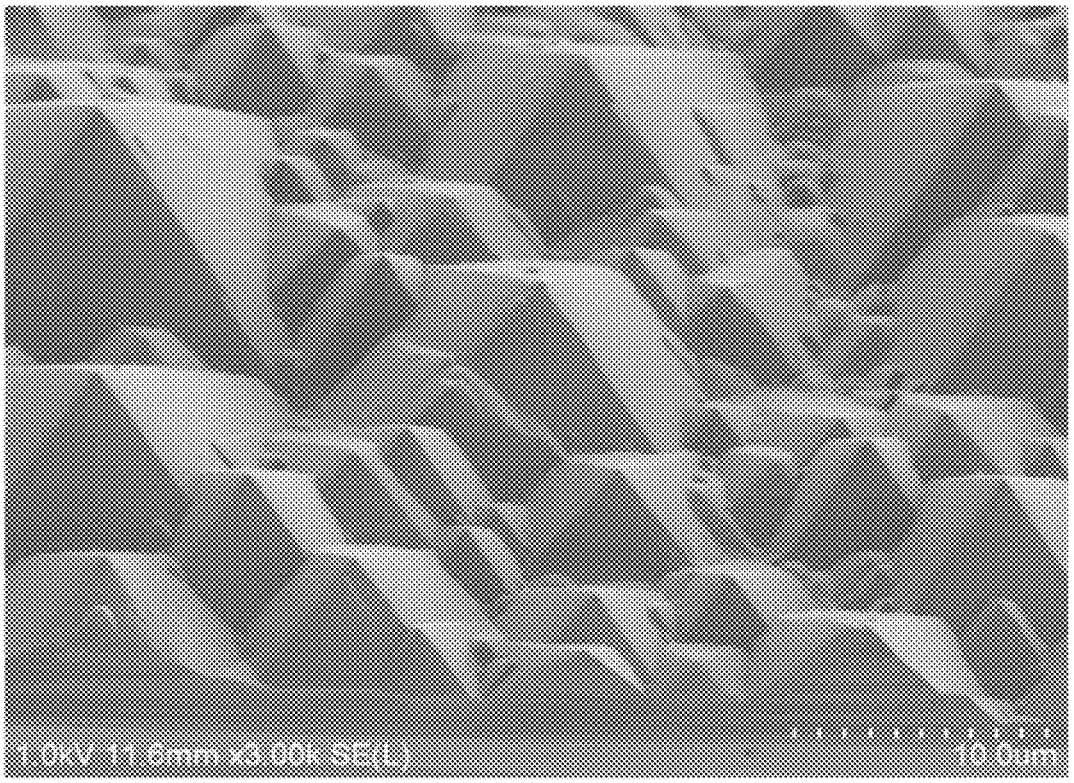
FIG. 1 is a scanning electron microscope image of monocrystalline silicon anisotropically etched with an alkaline solution according to embodiment 2.
Figure 2:
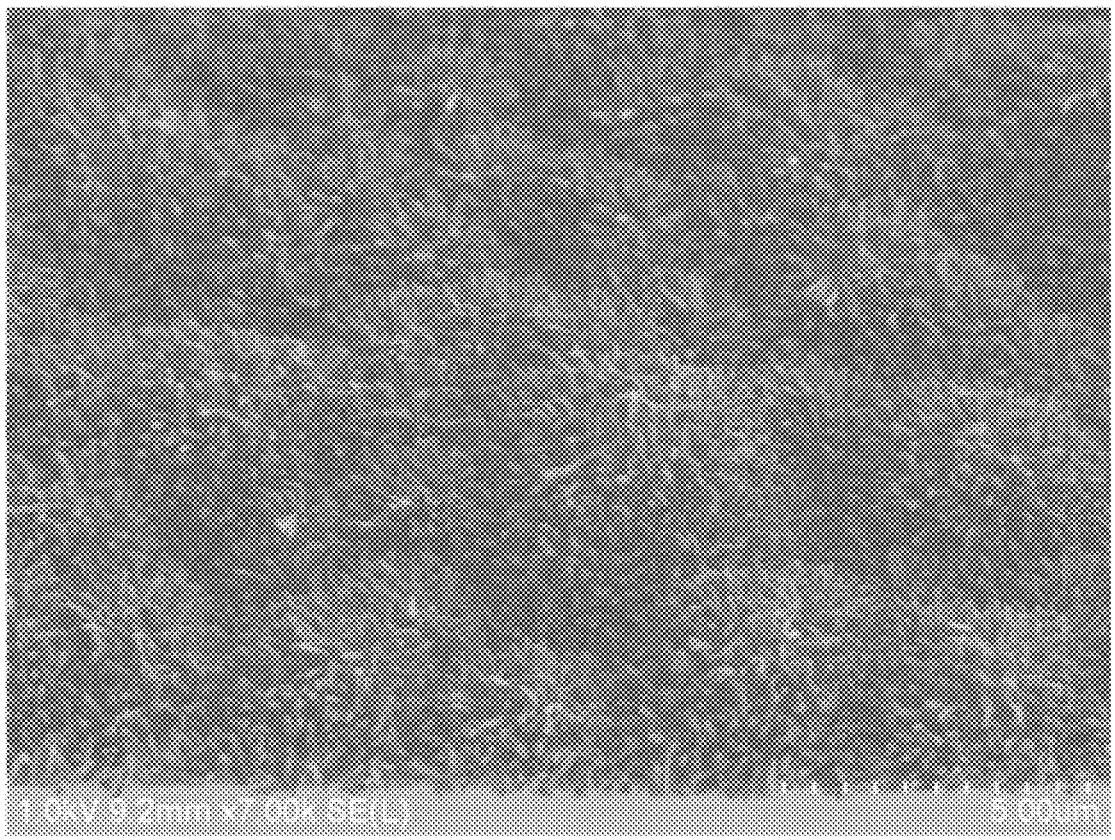
FIG. 2 is a scanning electron microscope image of the silicon wafer according to embodiment 2, wherein $TiO_2$ nano-rods are assembled on the surfaces of silicon cones.
Figure 3:
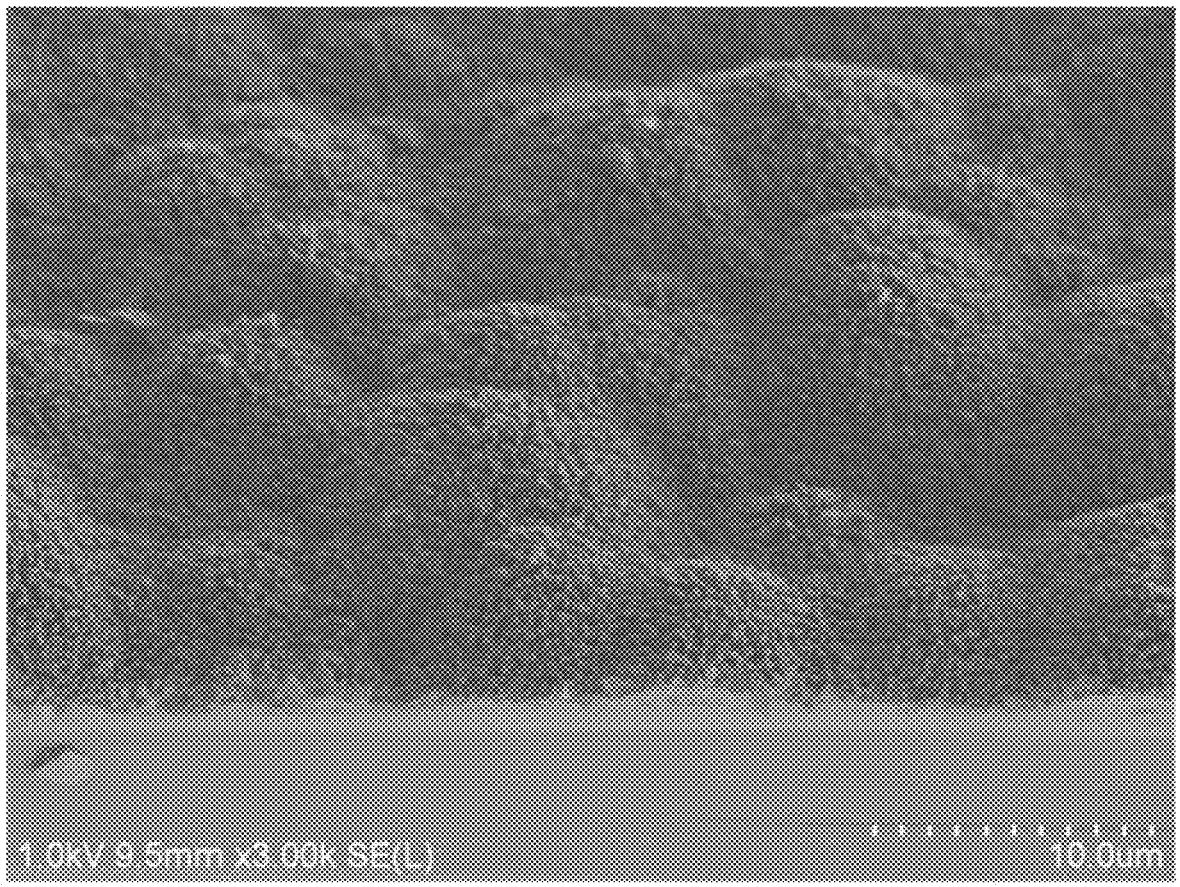
FIG. 3 is a scanning electron microscope image of a three-dimensional $Si/TiO_2/PPY$ composite material obtained by hierarchically assembling on the surface of silicon cones in embodiment 2.

Step 1: Preparation of Silicon Cones 100 mL of KOH solution having a pH value of 13 was prepared, and 25 mL of isopropanol was added into the solution. A silicon wafer was put into the solution, and the silicon wafer was etched for 30 min at 70° C. under continuous stirring in a mechanical stirring manner. After etching, the silicon wafer was flushed with distilled water, and then was blow-dried with nitrogen.

Step 2: Growing of $TiO_2$ Crystal Seeds on the Side Walls of the Silicon Cones

The silicon wafer with a silicon cone structure obtained in the step 1 was put into a mixed solution of $NH_3H_2O$, $H_2O_2$ and $H_2O$ in a volume ratio of 1:1:5 and heated. The heating temperature was 80° C. and the heating time was 30 min. Then, the silicon wafer was submerged into a 0.075 mol/L solution of tetrabutyl titanate in isopropanol, and the silicon wafer was pulled 20 times at a speed of 2 mm/s. Finally the sample was calcined for about 30 min in a muffle furnace under 450° C.

Step 3: Preparation of $TiO_2$ Nano-Rods Induced by $TiO_2$ Crystal Seeds $TiO_2$ nano-rods were grown on the silicon wafer carrying $TiO_2$ crystal seeds on surface thereof obtained in the step 2 under a hydrothermal synthesis condition. The hydrothermal synthesis condition was as follows: the silicon wafer was treated under the temperature of 130° C. for 8 h in a reaction kettle filled with 10 mL of deionized water, 10 mL of concentrated hydrochloric acid (a mass fraction of 37%) and 0.5 mL of tetrabutyl titanate, then the sample was taken out and blow-dried with nitrogen.

Step 4: In Situ Preparation of PPY Nano-Particles on the Surfaces of the $TiO_2$ Nano-Rods PPY nano-particles were deposited on the $TiO_2$ nano-rods obtained in the step 3 by an in-situ oxidation method. The reaction condition was as follows: putting 0.03 g $FeCl_3$, 112.8 uL pyrrole, 6 mL ultrapure water into a beaker to obtain a reaction solution. A silicon wafer having an area of 1.5 cm×1.0 cm with $TiO_2$ nano-rods grown on surface thereof was put into the reaction solution, and stirring was performed for 25 min at room temperature. After the end of reaction, a sample was took out and flushed with a large excess of water, and then a three-dimensional $Si/TiO_2/PPY$ composite material was obtained.

In the obtained three-dimensional $Si/TiO_2/PPY$ composite material, the average diameter of the PPY nano-particles was 35 nm, the average diameter of the $TiO_2$ nano-rods was 83 nm, the average height was 818 nm, and the average height of the silicon cones was 4.1 μm. By means of a ultraviolet diffuse reflection test, it is seen that the $Si/TiO_2/$ PPY hierarchical composite material showed excellent reflection elimination performance, and the light reflectivity is 9%. Upon a photocurrent test, it is obtained that the photocurrent of the Si/TiO$_2$/PPY hierarchical composite material was about 11 times and 7 times those of pure TiO$_2$ nano-rods and pure PPY respectively. By simulating the sunlight environment, it is found that the Si/TiO$_2$/PPY hierarchical composite material can photo-catalytically degrade methylene blue. Furthermore, the change of concentration of the methylene blue with time was observed in combination with an ultraviolet spectrophotometer, it is known that the methylene blue dye was completely degraded within 6.5 h, and the degradation efficiency was higher than those of pure TiO$_2$ nano-rods and pure PPY.

Embodiment 2

Step 1: Preparation of Silicon Cones 100 mL of KOH solution having a pH value of 13 was prepared, and 25 mL of isopropanol was added into the solution. A silicon wafer was put into the solution, and the silicon wafer was etched for 30 min at 70° C. under continuous stirring in a mechanical stirring manner. After etching, the silicon wafer was flushed with distilled water, and then was blow-dried with nitrogen.

Step 2: Growing of TiO$_2$ Crystal Seeds on the Side Walls of the Silicon Cones

The silicon wafer with a silicon cone structure obtained in the step 1 was put into a mixed solution of NH$_3$H$_2$O, H$_2$O$_2$ and H$_2$O in a volume ratio of 1:1:5 and heated. The heating temperature was 80° C. and the heating time was 30 min. Then, the silicon wafer was submerged into a 0.075 mol/L solution of tetrabutyl titanate in isopropanol, and the silicon wafer was pulled 20 times at a speed of 2 mm/s. Finally the sample was calcined for about 30 min in a muffle furnace under 450° C.

Step 3: Preparation of TiO$_2$ Nano-Rods Induced by TiO$_2$ Crystal Seeds

TiO$_2$ nano-rods were grown on the silicon wafer carrying TiO$_2$ crystal seeds on surface thereof obtained in the step 2 under a hydrothermal synthesis condition. The hydrothermal synthesis condition was as follows: the silicon wafer was treated under the temperature of 130° C. for 8 h in a reaction kettle filled with 10 mL of deionized water, 10 mL of concentrated hydrochloric acid (a mass fraction of 37%) and 0.5 mL of tetrabutyl titanate, then the sample was taken out and blow-dried with nitrogen.

Step 4: In Situ Preparation of PPY Nano-Particles on the Surfaces of the TiO$_2$ Nano-Rods PPY nano-particles were deposited on the TiO$_2$ nano-rods obtained in the step 3 by an in-situ oxidation method. The reaction condition was as follows: putting 0.03 g FeCl$_3$, 112.8 uL pyrrole, 6 mL ultrapure water into a beaker to obtain a reaction solution. A silicon wafer having an area of 1.5 cm×1.0 cm with TiO$_2$ nano-rods grown on surface thereof was put into the reaction solution, and stirring was performed for 15 min at room temperature. After the end of reaction, a sample was took out and flushed with a large excess of water, and then a three-dimensional Si/TiO$_2$/PPY composite material was obtained.

In the obtained three-dimensional Si/TiO$_2$/PPY composite material, the average diameter of the PPY nano-particles was 19 nm, the average diameter of the TiO$_2$ nano-rods was 83 nm, the average height was 818 nm, and the average height of the silicon cones was 4.1 μm. By means of an ultraviolet diffuse reflection test, it is seen that the Si/TiO$_2$/PPY hierarchical composite material showed excellent reflection elimination performance, and the light reflectivity is 6%. Upon a photocurrent test, it is obtained that the photocurrent of the Si/TiO$_2$/PPY hierarchical composite material was about 15 times and 10 times those of pure TiO$_2$ nano-rods and pure PPY, respectively. By simulating the sunlight environment, it is found that the Si/TiO$_2$/PPY hierarchical composite material can photo-catalytically degrade methylene blue. Furthermore, the change of concentration of the methylene blue with time was observed in combination with an ultraviolet spectrophotometer, it is known that the methylene blue dye was completely degraded within 5.5 h, and the degradation efficiency was higher than those of pure TiO$_2$ nano-rods and pure PPY.

Embodiment 3

Step 1: Preparation of Silicon Cones 100 mL of KOH solution having a pH value of 14 was prepared, and 25 mL of isopropanol was added into the solution. A silicon wafer was put into the solution, and the silicon wafer was etched for 15 min at 50° C. under continuous stirring in a mechanical stirring manner. After etching, the silicon wafer was flushed with distilled water, and then was blow-dried with nitrogen.

Step 2: Growing of TiO$_2$ Crystal Seeds on the Side Walls of the Silicon Cones

The silicon wafer with a silicon cone structure obtained in the step 1 was put into a mixed solution of NH$_3$H$_2$O, H$_2$O$_2$ and H$_2$O in a volume ratio of 1:1:5 and heated. The heating temperature was 90° C. and the heating time was 30 min. Then, the silicon wafer was submerged into a 0.1 mol/L solution of tetrabutyl titanate in isopropanol, and the silicon wafer was pulled 10 times at a speed of 2 mm/s. Finally the sample was calcined for about 30 min in a muffle furnace under 500° C.

Step 3: Preparation of TiO$_2$ Nano-Rods Induced by TiO$_2$ Crystal Seeds

TiO$_2$ nano-rods were grown on the silicon wafer carrying TiO$_2$ crystal seeds on surface thereof obtained in the step 2 under a hydrothermal synthesis condition. The hydrothermal synthesis condition was as follows: the silicon wafer was treated under the temperature of 120° C. for 8 h in a reaction kettle filled with 10 mL of deionized water, 10 mL of concentrated hydrochloric acid (a mass fraction of 37%) and 0.5 mL of tetrabutyl titanate, then the sample was taken out and blow-dried with nitrogen.

Step 4: In Situ Preparation of PPY Nano-Particles on the Surfaces of the TiO$_2$ Nano-Rods PPY nano-particles were deposited on the TiO$_2$ nano-rods obtained in the step 3 by an in-situ oxidation method. The reaction condition was as follows: putting 0.03 g FeCl$_3$, 112.8 uL pyrrole, 6 mL ultrapure water into a beaker to obtain a reaction solution. A silicon wafer having an area of 1.5 cm×1.0 cm with TiO$_2$ nano-rods grown on surface thereof was put into the reaction solution, and stirring was performed for 10 min at room temperature. After the end of reaction, a sample was took out and flushed with a large excess of water, and then a three-dimensional Si/TiO$_2$/PPY composite material was obtained.

In the obtained three-dimensional Si/TiO$_2$/PPY composite material, the average diameter of the PPY nano-particles was 12 nm, the average diameter of the TiO$_2$ nano-rods was 83 nm, the average height was 818 nm, and the average height of the silicon cones was 3.3 μm. By means of ultraviolet diffuse reflection test, it is seen that the Si/TiO$_2$/PPY hierarchical composite material showed excellent reflection elimination performance, and the light reflectivity is 4%. Upon a photocurrent test, it is obtained that the photocurrent of the Si/TiO$_2$/PPY hierarchical composite material was about 21 times and 14 times those of pure TiO$_2$ nano-rods and pure PPY, respectively. By simulating the sunlight environment, it is found that the Si/TiO$_2$/PPY hierarchical composite material can photo-catalytically degrade methylene blue. Furthermore, the change of concentration of the methylene blue with time was observed in combination with an ultraviolet spectrophotometer, it is known that the methylene blue dye was completely degraded within 5 h, and the degradation efficiency was higher than those of pure TiO$_2$ nano-rods and pure PPY.

The above description is only preferred embodiments of the present invention and not intended to limit the present invention, it should be noted that those of ordinary skill in the art can further make various modifications and variations without departing from the technical principles of the present invention, and these modifications and variations also should be considered to be within the scope of protection of the present invention.

What is claimed is:

1. A silicon-titanium dioxide-polypyrrole three-dimensional bionic composite material based on hierarchical assembly, comprising an ordered hierarchy (Si/TiO$_2$/PPY) of monocrystalline silicon (Si), titanium dioxide (TiO$_2$) and polypyrrole (PPY), wherein Si is 100-type monocrystalline silicon with a tapered microstructure surface and is a P-type semiconductor, and has compactly arranged silicon cone structure of tetragonal pyramids with a height of 4-10 μm;

TiO$_2$ is TiO$_2$ nano-rods of rutile phase and is an N-type semiconductor, and is quadrangular with a height of 500-4000 nm and a diameter of 40-250 nm, and orderly and vertically grown on the side walls of the silicon cones;

PPY is polypyrrole nano-particles with a diameter of 10-60 nm and is a P-type semiconductor, and is uniformly grown on the surfaces of the TiO$_2$ nano-rods;

in the Si/TiO$_2$/PPY three-dimensional bionic composite material, double P/N heterojunctions are formed on interfaces between Si and TiO$_2$ and between TiO$_2$ and PPY, such that the composite material can efficiently separate photo-generated charges while having a three-dimensional bionic composite structure, and can effectively reduce the reflection of incident light on the surface.

2. A preparation method of the silicon-titanium dioxide-polypyrrole three-dimensional bionic composite material based on hierarchical assembly as claimed in claim 1, comprising steps of:

(1) anisotropically etching a silicon wafer with an alkaline solution under stirring, to form compactly arranged tetragonal pyramids on the surface of the silicon wafer;

(2) performing hydrophilic treatment on the silicon wafer etched in the step (1), growing TiO$_2$ crystal seeds on the surface of the silicon wafer, and calcining the silicon wafer for a period of time in a muffle furnace, followed by naturally cooling the silicon wafer;

(3) putting the silicon wafer having TiO$_2$ crystal seeds on surface thereof obtained in the step (2) into a reactor, and growing TiO$_2$ nano-rods on the side walls of silicon cones by a hydrothermal synthesis method; and (4) depositing conductive PPY nano-particles on the TiO$_2$ nano-rods obtained in the step (3), to obtain the three-dimensional bionic Si/TiO$_2$/PPY.

3. The preparation method as claimed in claim 2, wherein the alkaline solution in step (1) is potassium hydroxide, tetramethylammonium hydroxide, sodium hydroxide, aqueous ammonia or EDP (a mixed solution of ethylenediamine, pyrocatechol and water), and the pH value of the alkaline solution being 12-14, the etching temperature being 50-90° C., the etching time is 5-60 min, and the stirring being mechanical stirring or magnetic stirring.

4. The preparation method as claimed in claim 2, wherein the hydrophilic treatment in the step (2) comprises putting the silicon wafer obtained in the step (1) into a mixed solution of NH$_3$H$_2$O, H$_2$O$_2$ and H$_2$O in a volume ratio of 1:1:5 and heating at a temperature of 90° C. for 30 min.

5. The preparation method according to claim 2, wherein growing TiO$_2$ crystal seeds in the step (2) comprises: submerging the silicon wafer after the hydrophilic treatment into a 0.05-1 mol/L solution of tetrabutyl titanate in isopropanol for pulling or spin coating, and calcining the resulting sample in the muffle furnace under 450-500° C. for 30-60 min, the pulling speed being 1-10 mm/s and the pulling being repeated 5-30 times, the spin coating speed being 500-7000 revolutions per min.

6. The preparation method as claimed in claim 2, wherein the hydrothermal synthesis in the step (3) comprises: treating the silicon wafer in the reactor containing 10-20 mL of deionized water, 6-17 mL of concentrated hydrochloric acid and 0.5-5 mL of tetrabutyl titanate at a temperature of 80-200° C. for 2-19 h, then taking the sample out and blow-drying it with nitrogen.

7. The preparation method as claimed in claim 2, wherein depositing conductive PPY nano-particles on the TiO$_2$ nano-rods in the step (4) comprises depositing PPY conductive polymer particles on the TiO$_2$ nano-rods by an in-situ oxidation method, and the reaction condition being as follows: putting 0.01-0.06 g FeCl$_3$, 50-150 uL pyrrole, and 5-10 mL ultrapure water into a beaker to obtain a reaction solution; putting a silicon wafer having an area of 1.5 cm×1.0 cm and having the TiO$_2$ nano-rods grown on surface thereof into the reaction solution, and stirring at room temperature for 10-60 min, to obtain the Si/TiO$_2$/PPY three-dimensional bionic composite material.

8. A photo-catalyst for degrading an organic pollutant comprising the silicon-titanium dioxide-polypyrrole three-dimensional bionic composite material based on hierarchical assembly as claimed in claim 1, wherein the three-dimensional Si/TiO$_2$/PPY composite material having an area of 1.5 cm×1.0 cm is put into 5 mL of 1.0×10$^{-5}$ mol/L methylene blue solution, then the solution is put in dark for 1 h to achieve an adsorption-desorption balance, and then the solution is irradiated by a light source to degrade methylene blue.

9. A photocatalysis and photoelectric conversion device comprising the silicon-titanium dioxide-polypyrrole three-dimensional bionic composite material based on hierarchical assembly as claimed in claim 1.

10. A solar cell comprising the silicon-titanium dioxide-polypyrrole three-dimensional bionic composite material based on hierarchical assembly as claimed in claim 1.

* * * * *